United States Patent [19]

Matsui et al.

[11] 4,307,372
[45] Dec. 22, 1981

[54] PHOTOSENSOR

[75] Inventors: Makoto Matsui; Hideaki Yamamoto, both of Hachioji; Eiichi Maruyama, Kodaira, all of Japan

[73] Assignee: Hitachi, Ltd., Tokyo, Japan

[21] Appl. No.: 108,783

[22] Filed: Dec. 31, 1979

Related U.S. Application Data

[63] Continuation of Ser. No. 799,963, May 24, 1977, abandoned.

[30] Foreign Application Priority Data

May 28, 1976 [JP] Japan .................................. 51-61148

[51] Int. Cl.³ .......................................... H01L 31/08
[52] U.S. Cl. ................................. 338/15; 250/211 R; 338/308; 338/309
[58] Field of Search ..................... 338/15, 18, 307–309; 73/355 R; 250/211 K, 211 R; 356/218, 222; 136/89

[56] References Cited

U.S. PATENT DOCUMENTS

| | | | |
|---|---|---|---|
| 2,965,867 | 12/1960 | Greig | 338/15 |
| 3,502,885 | 3/1970 | Stewart | 338/15 X |
| 3,551,870 | 12/1970 | Reynolds et al. | 338/15 |
| 3,636,492 | 1/1972 | Yamashita | 338/15 |

*Primary Examiner*—C. L. Albritton
*Attorney, Agent, or Firm*—Craig and Antonelli

[57] ABSTRACT

In a thin-film photosensor comprising a transparent electrode deposited on one surface of a thin layer of photoconductor, and a counter electrode deposited on the other surface thereof, a photosensor for use in a photosensor array of a facsimile transmitter or the like characterized in that part of the transparent electrode other than a window for incidence of a light signal is covered with an opaque thin film.

14 Claims, 15 Drawing Figures

PHOTOSENSOR

This is a continuation of application Ser. No. 799,963, filed May 24, 1977, now abandoned.

BACKGROUND OF THE INVENTION

This invention relates to a photosensor. More particularly, it relates to a thin-film photosensor, which can be used in, for example, the photosensor array of a facsimile transmitter or the like as a photoelectric converter for plane picture information.

Heretofore, a linear array of silicon photodiodes has been generally employed as a photoelectric conversion sensor for a facsimile transmitter. Since, however, the size of a silicon single crystal being producible is subject to limitation, the linear array of silicon photodiodes is difficult to be elongated.

On the other hand, a thin film photosensor array employing a CdSe film, an Se-As-Te amorphous thin film or the like as a photoconductor can be produced by the vacuum evaporation and can therefore be made elongated. A transparent electrode used in such sensor, however, has had the disadvantages that the resistivity thereof is high as compared with that of a metal, so the wiring resistance becomes high when the transparent electrode is wired as a minute electrode, and that when the part of the electrode other than a window for the incidence of a light signal is left transparent, unnecessary light signals are mixed to degrade the resolution of an image picked up. A further disadvantage is that in case of electrically connecting the transparent electrode and a wiring conductor, two photoetching steps of high precision are required for individually forming them.

SUMMARY OF THE INVENTION

An object of this invention is to provide an improved photosensor.

Another object of this invention is to provide a photosensor which is formed with a transparent electrode window for the incidence of a light signal.

Still another object of this invention is to provide a photosensor in which one of electrodes thereof is made of a double film consisting of an opaque metallic thin film of high conductivity and a transparent conductive film, thereby making it possible to fabricate the connection wiring between a transparent electrode window and an electrode highly precisely and simply by the method of self-alignment.

The above-mentioned and other objects are accomplished by a thin-film photosensor comprising a transparent electrode deposited on one surface of a thin layer of photoconductor, and a counter electrode deposited on the other surface thereof, characterized in that the other part of the transparent electrode than a window for incidence of a light signal is covered with an opaque thin film.

BRIEF DESCRIPTION OF THE DRAWINGS

FIG. 1 is a plan view of an embodiment of this invention, while FIGS. 2A-2F and 2A'-2F' are views for elucidating the manufacturing steps of the device shown in FIG. 1, among which

DETAILED DESCRIPTION OF THE PREFERRED EMBODIMENTS

Figure 1:
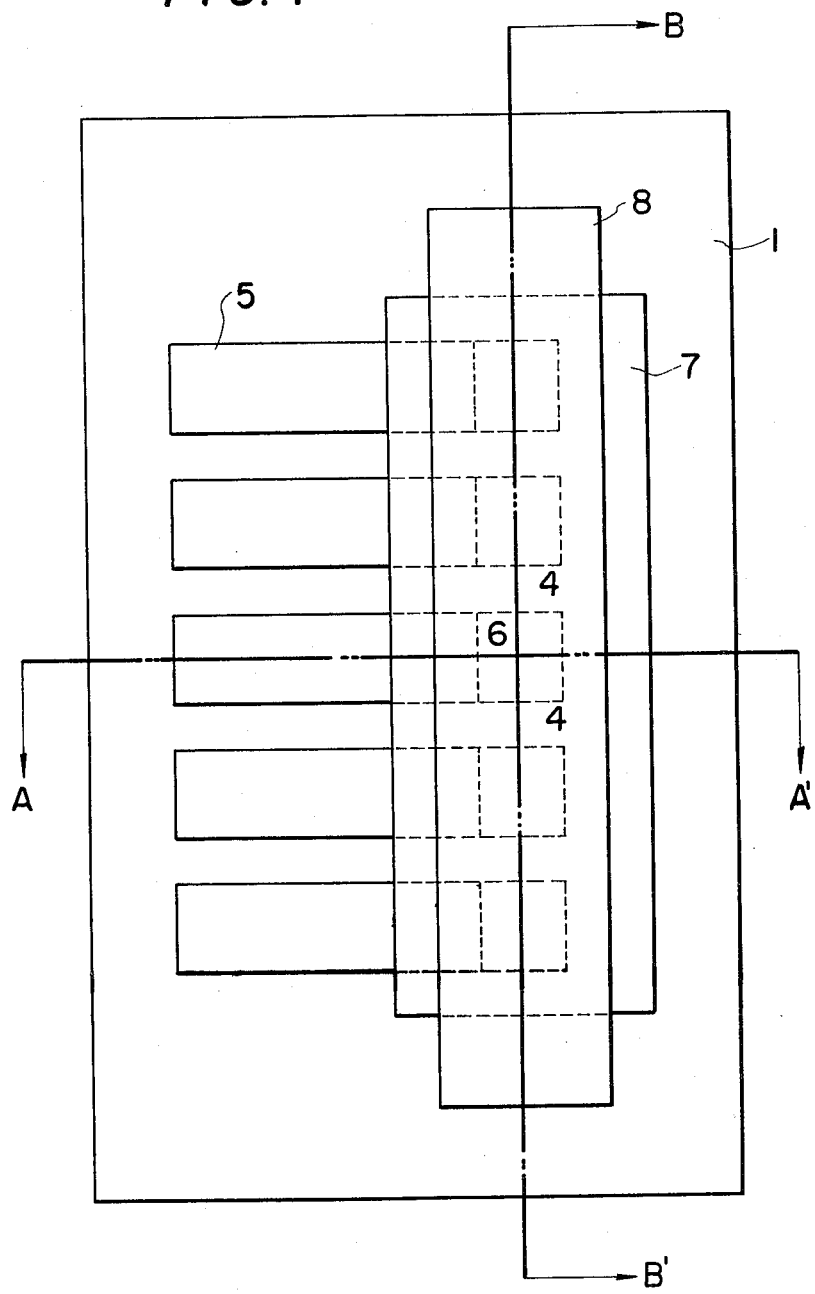
Figure 2A:
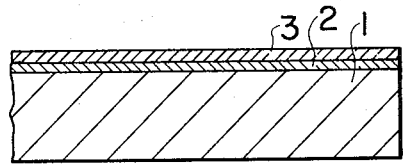
FIGS. 2A-2F show parts of sections A—A' in FIG. 1 and FIGS. 2A'-2F' parts of sections B—B'.
Figure 2B:
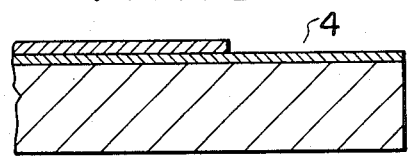
Figure 2C:
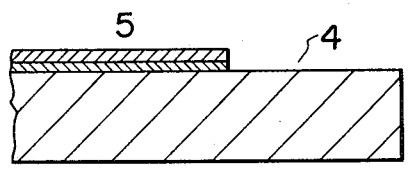
Figure 2D:
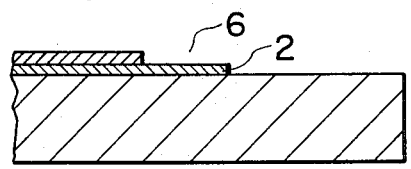
Figure 2E:
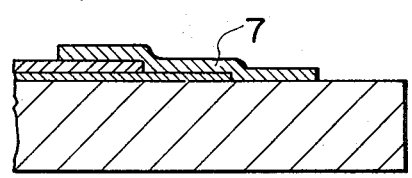
Figure 2F:
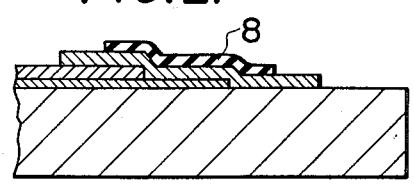
Figure 2A:
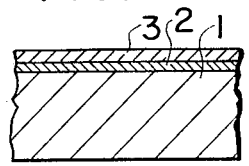
Figure 2B:
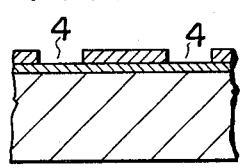
Figure 2C:
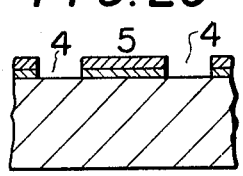
Figure 2D:
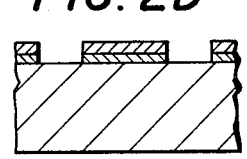
Figure 2E:
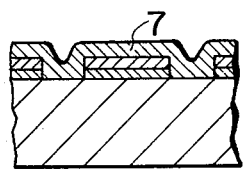
Figure 2F:
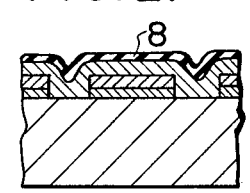

This invention will be described with reference to the drawings. FIG. 1 is a plan view of an embodiment of this invention. Stretched stripe-shaped lower electrodes 5 and a photoconductor layer 7 are provided on the surface of a transparent substrate 1, and an upper electrode 8, e.g. metallic thin film, is provided on the side of the photoconductor layer 7 opposite to the lower electrodes. The lower electrode 5 is made up of a transparent layer 2 and a thin opaque layer 3 (see FIG. 2A). Parts 6 of the lower electrode 5 are transparent electrode windows for the incidence of light signals. Since the thin film of the photoconductor layer 7 has a high electric resistance, the photoconductor layer 7 itself need not be cut, but only the lower electrodes 5 may be divided. Illustrated in FIG. 1 is a case where input light comes into incidence through the transparent substrate 1 from below the lower electrodes 5, that is, from the back of the drawing sheet. The transparent electrode window 6 of the lower electrode 5 serves to enhance the utilization factor of the light. By forming the rest of the lower electrode 5 with an opaque and conductive substance, e.g. a metallic thin film 3, the other part than the window 6 for the incidence of the light signal can be made opaque.

Any metal can be used as the substance for forming such an opaque thin film 3. Especially desirable are chromium, titanium, silver, aluminum, gold, beryllium, bismuth, cadmium, cobalt, copper, iron, indium, manganese, molybdenum, niobium, nickel, lead, palladium, platinum, rhodium, tin, tantalum, vanadium, tungsten, zinc and zirconium.

Many substances are known as materials for forming the photoconductor layer 7, and they can be employed for this invention. Desirable are a CdSe film, Se-As-Te amorphous film, CdS film, Te film, Se film, $As_2Se$ film, CdTe film, $Sb_2S_3$ film, PbO film, PbS film, Si amorphous film, Ge amorphous film, GaAs film, ZnTe film and any mixture thereof.

As the transparent conductive film 2, known ones are employed. Many of them consist essentially of tin oxide, indium oxide, etc. At the formation of the transparent conductive film 2, it is necessary to heat the substrate to a high temperature above 300° C. In order to prevent undesirable effects on the photoconductor layer 7, therefore, the transparent electrode is desirably formed on the substrate 1 in advance.

The photosensor of this invention can be manufactured by, for example, a method as described below. On a transparent substrate 1 such as of glass, a transparent conductive film 2 and an opaque metallic thin film 3 are formed one over the other. After working the metallic thin film 3, the transparent conductive film 2 is worked by using the worked metallic thin film as a mask. Subsequently, parts of the metallic thin film 3 are removed to form transparent electrode windows 6 for the incidence of light signals.

Hereunder, this invention will be described in detail in connection with embodiments.

Embodiment 1

A plan view of the electrode structure of an Se-As-Te system amorphous semiconductor photosensor array having transparent electrode windows 6 for the incidence of light signals is shown in FIG. 1, while sectional views for explaining the manufacturing steps of the photosensor array are shown in FIGS. 2A-2F and FIGS. 2A'-2F'. The fragmentary sectional views of FIGS. 2A-2F are taken along A—A' in FIG. 1, and those of FIGS. 2A'-2F' along B—B'. On the surface of a glass substrate 1, a transparent conductive film of tin oxide 2 is deposited to a thickness of 1000 A. Further, a chromium film 3 is deposited thereon to a thickness of 2000 A. In order to form opaque stripe-shaped electrodes, the chromium film 3 at positions corresponding to an unnecessary part 4 in FIG. 2B and FIG. 2B' is removed by the photo etching, whereupon using the remaining chromium film 3 as a mask, the tin oxide transparent conductive film 2 at positions corresponding to the unnecessary part 4 in FIG. 2C and FIG. 2C' is removed by the sputter etching. Thus, the opaque stripe-shaped lower electrodes 5 (at 5 in FIG. 2C and FIG. 2C') are formed. When the chromium film 3 at end parts (positions as indicated at 6 in FIG. 2D and FIG. 2D') of the lower electrodes 5 formed in this way is photo-etched, the tin oxide transparent conductive film 2 is left at the end parts to form transparent electrode windows 6 for the incidence of light signals. On the resultant substrate, an Se-As-Te photoconductor layer 7 having a thickness of 4 $\mu$m is formed by the evaporation using a shadow mask. Further, an upper electrode 8 made of a gold thin film is formed thereon by the evaporation using a shadow mask. Input light is given from the side of the substrate 1. Since, according to this electrode structure, the other parts than the transparent electrode windows 6 for the incidence of light signals are covered with the chromium film 3 and are opaque, unnecessary light signal currents are not mixed, so that the resolution of an image picked up is high. Besides, owing to the chromium wiring, the wiring resistance is low even when a minute wiring is carried out. In this manner, according to the present embodiment, an electrode structure having the two advantages of high resolution and low wiring resistance can be simply fabricated. Moreover, it is possible to make the photosensor array elongated. Therefore, the photosensor of this invention is useful as a sensor for a facsimile. Although the photosensor having the five transparent electrode windows has been mentioned in the present embodiment, the number of the windows can of course be arbitrarily increased.

Embodiment 2

The present embodiment is one of a CdSe film photosensor array having the same electrode structure as in Embodiment 1. It employs a titanium film of a thickness of 1000 A instead of the chromium film 3 in the case of Embodiment 1, a CdSe film of a thickness of 2 $\mu$m as the photoconductor layer 7, and an aluminum film as the upper electrode 8. Referring again to FIG. 1, FIGS. 2A-2F and FIGS. 2A'-2F', stripe-shaped lower electrodes 5 of a double structure consisting of a tin oxide transparent conductive film 2 and a titanium film 3 are formed on the surface of a glass substrate 1 and the titanium film at end parts thereof is removed to form transparent electrode windows 6 by the same method as in Embodiment 1. Subsequently, while holding the substrate temperature at 150° C., the CdSe film of the photoconductor layer 7 is subjected to the evaporation using a shadow mask in a vacuum of $3 \times 10^{-6}$ Torr. Upon completion of the evaporation, the whole substrate is heated at 350° C. in an atmosphere of $O_2$ under the normal pressure for one hour, to promote the recrystallization of the photoconductor layer 7 of the CdSe film and to render the sensitivity high. Thereafter, while holding the glass substrate 1 at the room temperature, the upper electrode 8 of the aluminum film is formed on the photoconductor layer 7 of the CdSe film by evaporation using a shadow mask.

Embodiment 3

Description will now be made of an example of a photoelectric transducer which converts picture information on a plane information recording medium into time sequential electric signals by the use of the photosensor array of this invention.

In case of employing the photosensor of this invention for a facsimile transmitter or the like, a system wherein the photosensor array of this invention arranged rectilinearly is used as a photoelectric transducer for plane picture information and wherein the plane scanning is performed by the electrical scanning in a certain direction and the mechanical scanning of an information recording medium in a direction orthogonal thereto has the merits of a high speed, a long life, etc.

Figure 3:
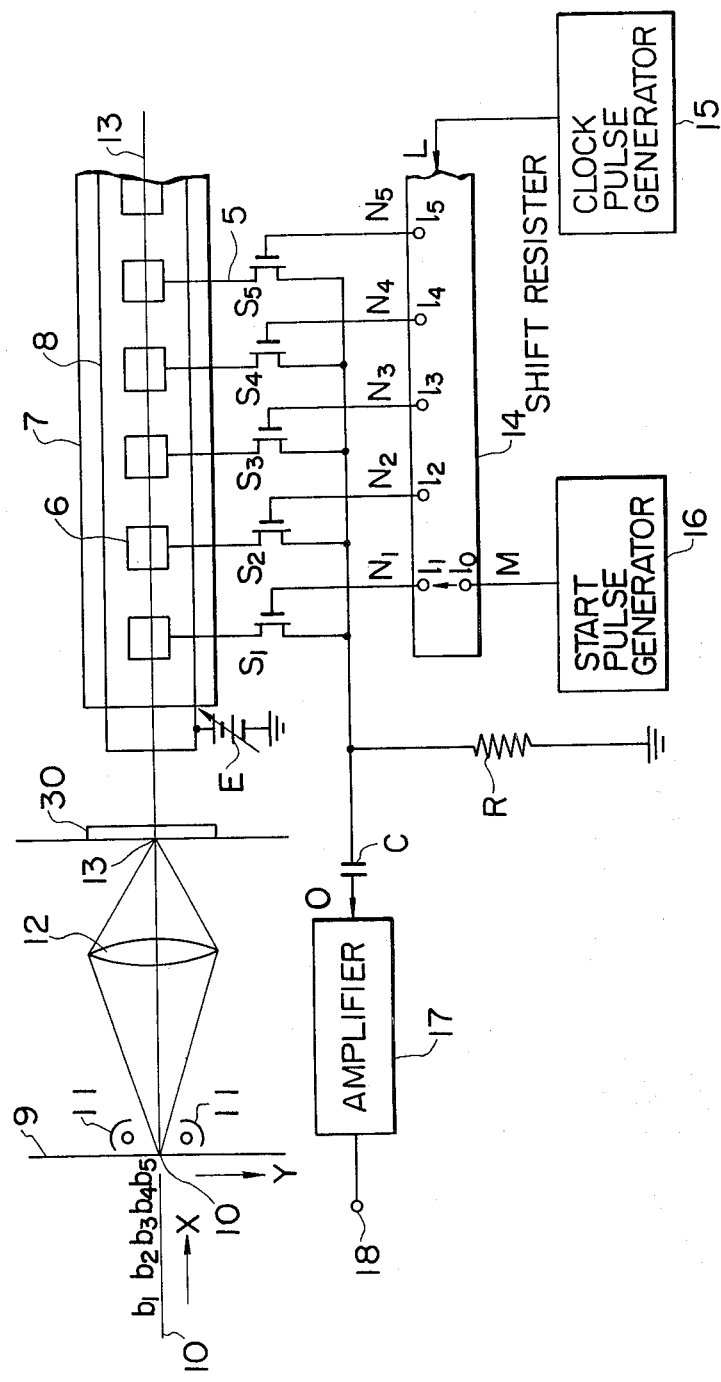
FIG. 3 is a circuit diagram of a facsimile transmitter employing the photosensor of this invention.
Figure 4:
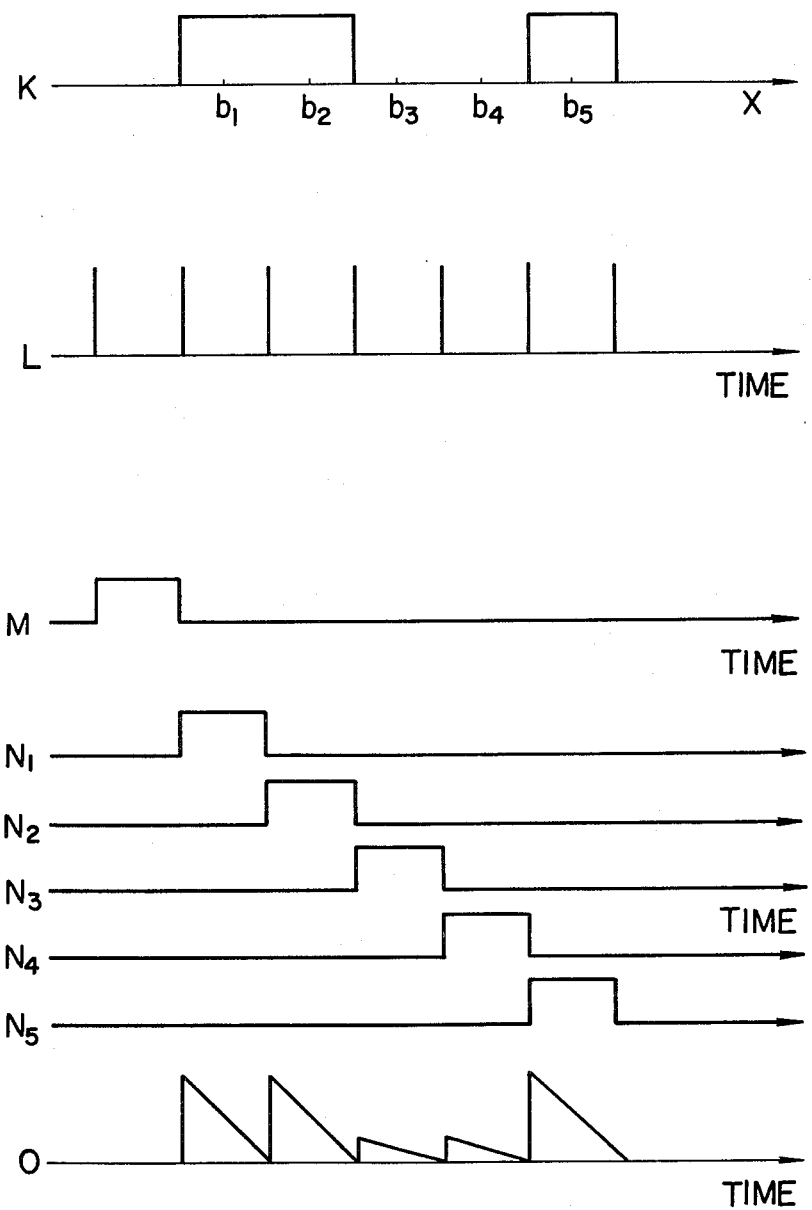
FIG. 4 is a waveform diagram of signals at various parts in the circuit of FIG. 3.

FIG. 3 is a diagram of an embodiment of a circuit for executing the electrical switching and scanning, while FIG. 4 is a diagram of signal waveforms in the circuit of FIG. 3.

Shown in FIG. 3 are an optical system and an electric circuit system. In this example, only a part of an array of photosensors each being equipped with five stripe-shaped electrodes is illustrated, and the other part is omitted.

Referring to FIG. 3, numeral 9 designates a picture plane, numeral 10 a straight portion for conducting the photoelectric transduction (extending normally to the drawing sheet), numeral 11 an illumination system, numeral 12 a lens, and numeral 13 an imaging portion corresponding to the straight portion 10 on the photosensor array 30 of this invention. $S_1-S_5$ represent switches which turn "on" when signals $N_1-N_5$ are applied respectively and which are "off" at the other times (for example, switches which employ field-effect transistors). Numeral 14 indicates a scanning circuit by which a start signal M applied to an input terminal $l_0$ is sequentially delivered to terminals $l_1-l_5$ (for example, made of a shift register), numeral 15 a scanning control circuit which delivers a clock signal L for operating the scanning circuit, numeral 16 an output circuit of the start signal M to be applied to the input terminal $l_0$ of the scanning circuit during the period of electrical scanning, and numeral 17 an amplifier circuit which amplifies output signals O of the stripe-shaped lower electrodes 5. Shown at 18 is an output terminal. Letter E denotes a power supply for biasing the upper electrode 8 to a positive (negative) potential, letter R a resistance, and letter C a capacitance. The electrical scanning is performed along the straight portion 10 and in the direction X normal to the drawing sheet, while the mechanical scanning is performed in the direction Y orthogonal thereto.

Hereunder, the operation of the circuit in FIG. 3 will be explained with reference to FIG. 4. When the start signal M is impressed, the scanning circuit 14 is operated by the clock signal L having a frequency of 500 Hz, the switches $S_1-S_5$ are endowed with the signals $N_1-N_5$ and turn "on" in succession, and the output signal O is fed to the amplifier circuit 17. Accordingly, in case where the states of brightnesses at points $b_1$-$b_5$ on the straight portion 10 lying on the picture plane 9 and intersecting orthogonally to the drawing sheet are as shown at K in FIG. 4, the output signals O become as shown at O in FIG. 4 respectively, and the outputs from the output terminal 18 become signals coincident with the brightnesses at K.

As set forth above, according to the photosensor of this invention, there are achieved the effects that a real image of excellent imaging performance and high brightness can be formed of light signals from one straight portion on a plane picture and that the time-sequential high-resolution photoelectric transduction of the plane picture can be done in addition to the electrical switching and scanning of a photocell array as well as the mechanical scanning in a direction orthogonal to that of the electrical scanning.

Although the lens 12 is employed in the embodiment of FIG. 3, a system is also possible in which the photosensor array 30 is used in close proximity to the picture plane 9 without employing the lens.

Although, in the foregoing embodiments, the case of projecting the input light from the side of the glass substrate 1 has been exemplified, it is also possible to adopt a construction in which the input light is projected from the side of the upper electrode 8. This construction can be realized by, for example, providing windows in the upper electrode 8 in the same way as in the embodiments and providing no window in the lower electrode 5. Although, in the foregoing embodiments, the lower electrode 5 has been made stripe-shaped, it is of course possible to put the upper electrode 8 into the stripe shape.

As apparent from the above explanation, according to this invention, a photosensor which is equipped with electrodes of high resolution and low series resistance can be easily fabricated, and a photosensor array can be made elongated, so that the photosensor is useful as a sensor for a facsimile, etc.

We claim:

1. In a thin-film photosensor comprising an electrode of a transparent conductive film and an opaque metallic thin film of high conductivity both of which are deposited on one surface of a thin layer of photoconductor between the photoconductor and the source of incident light, and a counter electrode deposited on the other surface thereof, the improvement comprising said transparent conductive film other than a window for incidence of a light signal being covered with the opaque thin metallic film to limit the light applied to the photoconductor to attain high resolution and to allow low resistance coupling to lead wires.

2. In a thin-film photosensor comprising an electrode of a transparent conductive film and an opaque metallic film of high conductivity both of which are deposited on one surface of a thin layer of photoconductor between the photoconductor and the source of incident light, and a counter electrode deposited on the other surface thereof, wherein the improvement comprises that said transparent conductive film is provided on a transparent substrate, that the opaque metallic film is provided on said transparent conductive film except its position corresponding to a window for incidence of a light signal to limit the light applied to the photoconductor to attain high resolution, and to allow low resistance coupling to lead wires, that said thin layer of photoconductor is provided over said electrode and said window for incidence of a light signal in said transparent conductive film, and that said counter electrode is deposited on at least a part of said thin layer of photoconductor.

3. A photosensor according to claim 1, wherein said metallic thin film is a thin film of a metal selected from the group consisting of chromium, titanium, silver, aluminum, gold, beryllium, bismuth, cadmium, cobalt, copper, iron, indium, manganese, molybdenum, niobium, nickel, lead, palladium, platinum, rhodium, tin, tantalum, vanadium, tungsten, zinc and zirconium.

4. A photosensor according to claim 1, wherein said metallic thin film is a chromium thin film.

5. A photosensor according to claim 1, wherein said metallic thin film is a titanium thin film.

6. A photosensor according to claim 1, wherein said counter electrode is a metallic thin film.

7. A photosensor according to claim 6, wherein said metallic thin film is an aluminum thin film.

8. A photosensor according to claim 1, wherein said thin layer of photoconductor is a film of at least one selected from the group consisting of a CdSe film, and Se-As-Te amorphous film, a CdS film, a Te film, an Se film, an $As_2Se$ film, a CdTe film, an $Sb_2S_3$ film, a PbO film, a PbS film, an Si amorphous film, a Ge amorphous film, a GaAs film, a ZnTe film, and a film of any mixture thereof.

9. A photosensor array comprising:
   a transparent substrate:
   a plurality of stripe-shaped electrodes provided on said transparent substrate, each comprising a transparent conductive film and an opaque metallic thin film provided in contact with said transparent conductive film except at a position corresponding to a window for incidence of a light signal;
   a thin layer of photoconductor contiguous with and overlapping at least the opaque metallic thin film of said electrodes and said windows; and
   a counter electrode provided on the side of said photoconductor opposite to said transparent electrodes.

10. A photosensor array comprising:
    a transparent substrate;
    a stripe-shaped electrode provided on said transparent substrate comprising a transparent conductive film and an opaque metallic thin film provided in contact with said transparent conductive film except at a position corresponding to a window for incidence of a light signal;
    a thin layer of photoconductor contiguous with and overlapping at least the opaque metallic thin film of said electrode and said window; and
    a plurality of stripe-shaped counter electrodes provided on the side of said photoconductor opposite to said transparent electrodes.

11. A photosensor array comprising:
    a transparent substrate;
    a plurality of stripe-shaped electrodes provided on said transparent substrate, each comprising a transparent conductive film and an opaque metallic thin film provided in contact with said transparent conductive film except at a position corresponding to a window for incidence of a light signal;
    a thin layer of photoconductor contiguous with and overlapping both at least portions of each of the conductive films and opaque metallic thin films of said electrodes and said windows; and a counter electrode provided on the side of said photoconductor opposite to said transparent electrodes.

12. A photosensor according to claim 2, wherein said thin layer of photoconductor is further provided on a part of said opaque thin film.

13. A photosensor according to claim 6, wherein said metallic thin film is a gold thin film.

14. A photosensor array comprising:
- a transparent substrate;
- a stripe-shaped electrode provided on said transparent substrate comprising a transparent conductive film and an opaque metallic thin film provided in contact with said transparent conductive film except at a position corresponding to a window for incidence of a light signal;
- a thin layer of photoconductor contiguous with and overlapping both at least a portion of each of the conductive film and opaque metallic film of said electrode and said window; and
- a plurality of stripe-shaped counter electrodes provided on the side of said photoconductor opposite to said transparent electrodes.

* * * * *